United States Patent
Teng et al.

(10) Patent No.: US 9,373,579 B2
(45) Date of Patent: Jun. 21, 2016

(54) PROTECTING LAYER IN A SEMICONDUCTOR STRUCTURE

(71) Applicant: Taiwan Semiconductor Manufacturing Company, Ltd., Hsin-Chu (TW)

(72) Inventors: Chi-Lin Teng, Taichung (TW); Hai-Ching Chen, Hsin-Chu (TW); Tien-I Bao, Dayuan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 6 days.

(21) Appl. No.: 13/787,381

(22) Filed: Mar. 6, 2013

(65) Prior Publication Data

US 2014/0167229 A1    Jun. 19, 2014

Related U.S. Application Data

(60) Provisional application No. 61/737,573, filed on Dec. 14, 2012.

(51) Int. Cl.
| | |
|---|---|
| *H01L 23/58* | (2006.01) |
| *H01L 23/522* | (2006.01) |
| *H01L 23/532* | (2006.01) |
| *H01L 21/768* | (2006.01) |

(52) U.S. Cl.
CPC ...... *H01L 23/5226* (2013.01); *H01L 21/76826* (2013.01); *H01L 21/76832* (2013.01); *H01L 21/76834* (2013.01); *H01L 21/76885* (2013.01); *H01L 23/5329* (2013.01); *H01L 23/53238* (2013.01); *H01L 23/53295* (2013.01); *H01L 2924/0002* (2013.01)

(58) Field of Classification Search
CPC ............... H01L 23/5226; H01L 23/53238; H01L 23/5329; H01L 23/53295; H01L 23/58
USPC .............. 257/649, 751, 767, E23.118; 438/5, 438/627, 643, 653
See application file for complete search history.

(56) References Cited

U.S. PATENT DOCUMENTS

| | | | | |
|---|---|---|---|---|
| 7,122,878 | B2 * | 10/2006 | Huang et al. ................. | 257/532 |
| 2005/0170583 | A1 * | 8/2005 | Park .............................. | 438/253 |
| 2008/0277797 | A1 * | 11/2008 | Yu et al. ........................ | 257/762 |
| 2008/0311739 | A1 | 12/2008 | Besling et al. | |
| 2010/0221911 | A1 * | 9/2010 | Aubel et al. .................. | 438/643 |
| 2011/0049705 | A1 * | 3/2011 | Liu .......................... | H01L 24/11 257/737 |
| 2014/0045331 | A1 * | 2/2014 | Gordon et al. ............... | 438/653 |

* cited by examiner

*Primary Examiner* — Jae Lee
*Assistant Examiner* — Colleen E Snow
(74) *Attorney, Agent, or Firm* — Slater Matsil, LLP

(57) ABSTRACT

A semiconductor structure comprises a dielectric layer, a conduction piece, a first metal piece, a first protecting layer, and a second protecting layer. The conduction piece is surrounded by electrical materials of the dielectric layer. The first metal piece is over the dielectric layer and is in contact with the conduction piece. The first protecting layer covers dielectric materials of the dielectric layer that are not covered by the first metal piece. The second protecting layer is over the first protecting layer.

19 Claims, 5 Drawing Sheets

PROTECTING LAYER IN A SEMICONDUCTOR STRUCTURE

This application claims the benefit of U.S. Provisional Application Ser. No. 61/737,573, filed on Dec. 14, 2012, entitled "Protecting Layer in a Semiconductor Structure," which application is hereby incorporated herein by reference.

FIELD

The present disclosure is related to a protecting layer in a semiconductor structure.

BACKGROUND

As semiconductor technology nodes advance, dimensions of interconnect metal lines in interconnect layers continue to shrink. As a result, in some conditions, an electrical current flowing through an interconnect metal line causes signal unreliabilities and/or failures due to electromigration (EM) phenomena, which refer to changes in locations of atoms in the interconnect lines and layers. To improve the conditions, a precursor soak process with metal oxide, metal nitride and/or metal oxynitride and a plasma treatment are used in a formation of a capping layer over the interconnect metal lines. Such precursor soak and plasma treatment processes, however, cause damages to a low-K dielectric layer because of metal ion diffusion into the low-K dielectric layer, for example.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
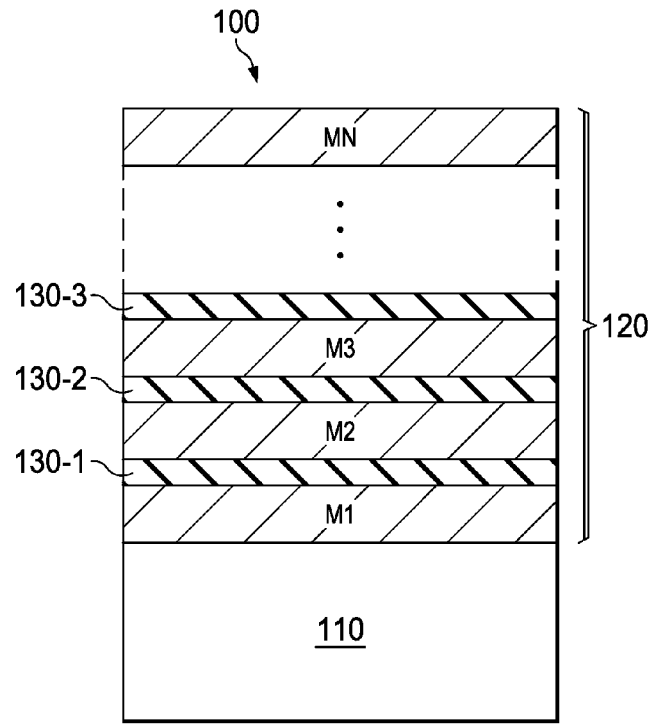
FIG. 1 is a cross section diagram of a semiconductor structure, in accordance with some embodiments, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have at least one of the following features and/or advantages. In some embodiments, a protecting layer is provided to reduce and/or eliminate electromigration (EM) phenomena and metal ion diffusion into a low-K dielectric layer. For example, the low-K dielectric layer is not damaged even when a time to process metal oxide, metal nitride and/or metal oxynitride in a capping layer is prolonged. Consequently, various embodiments of the present disclosure are advantageous over existing approaches in which a prolonged capping process damages the low-K dielectric layer. The protecting layer also reduces and/or eliminates plasma conversion into the low-K dielectric layer.

Semiconductor Device Structure

FIG. 1 is a cross section diagram of a semiconductor structure 100, in accordance with some embodiments. Structure 100 includes a substrate 110 and an interconnect layer 120.

Substrate 110 includes poly regions, oxide diffusion (OD) regions, semiconductor wells, etc., based on which semiconductor devices are formed. Exemplary semiconductor devices include transistors, diodes, capacitors, etc. Exemplary semiconductor wells include N-wells, P-wells, deep N-wells, deep P-wells, etc. These various elements are not shown in the figures, as they are not necessary for an understanding of the inventive concepts disclosed herein. Materials used in substrate 110 include semiconductor materials, such as silicon, germanium, etc. Other materials are within the scope of various embodiments.

Interconnect layer 120 includes N conductive layers M1 to MN wherein N is an integer number. In some embodiments, conductive layers M1 to MN include metal, such as copper (Cu), and are called metal layers M1 to MN. For example, conductive layer M1 is called metal one layer, conductive layer M2 is called metal two layer, conductor layer M3 is called metal three layer, etc. Conductive layers M1 to MN provide conductor lines used to connect different elements of semiconductor devices and/or to connect different semiconductor devices together.

Interconnect layer 120 also includes vias, dielectric materials, passivation layers, bonding pads, packaging resources, etc., which, for simplicity, are not shown. Between metal layers M1 to MN are dielectric layers 130-1, 130-2, 130-3, etc., used to insulate corresponding metal layers M1 to MN. For illustration, a dielectric layer 130-1, 130-2, 130-3, etc., is called a dielectric layer 130.

Dielectric layer 130 is formed using different techniques, such as tetraethyl orthosicilate (TEOS), chemical vapor deposition (CVD), plasma enhanced CVD (PECVD), low pressure CVD (LPCVD), spin-on coating, etc. Other techniques are within the scope of various embodiments.

Each of a dielectric layer 130 includes a dielectric material, which, for simplicity, is also called a dielectric material 130. Dielectric material 130 includes, for example, carbon-doped silicon dioxide (or organosilicate glass (OSG)), carbon-oxide, borophosphosilicate glass (BPSG), borosilicate glass (BSG), phosphosilicate glass (PSG). Other materials are within the scope of various embodiments.

Dielectric material 130 has a constant K value that is called low K or high K with reference to a constant K value of silica. For example, in some embodiments, a constant K value of silica is 4. Dielectric material 130 having a constant K value less than 4 is called a low-K material or low-K. In contrast, dielectric material 130 having a constant K value higher than 4 is called a high-K material.

Semiconductor Structure Through Various Manufacturing Stages

FIGS. 2A to 2F are cross section diagrams of interconnect layer 120 through various manufacturing process stages, in accordance with some embodiments. For illustration, in FIGS. 2A to 2F, only metal layer M1, dielectric layer 130-1, and metal layer M2 in FIG. 1 and corresponding details are shown.

Figure 2A:
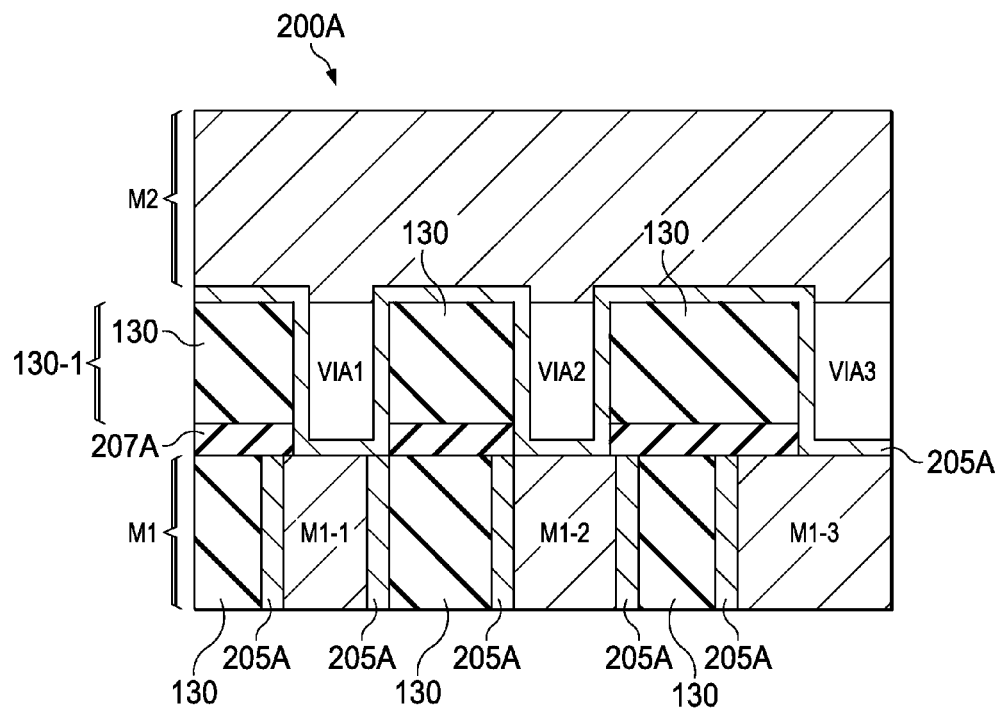
FIGS. 2A to 2F are cross section diagrams of interconnect layer 120 through various manufacturing process stages, in accordance with some embodiments.

In a semiconductor structure 200A in FIG. 2A, metal layer M1 includes three pieces of metal or three metal bars M1-1, M1-2, and M1-3 separated by dielectric material 130. Each of a metal bar M1-1, M1-2, and M1-3 is used to form a conductive line to connect circuit elements formed on various semiconductor structures, such as semiconductor structures used in the illustration of FIG. 2A to FIG. 2F.

A barrier layer 205A separates metal from dielectric material. For example, a barrier layer 205A separates metal layer M2 and vias VIA1, VIA2, and VIA3 from dielectric material 130 of dielectric layer 130-1. For another example, each of a metal bar M1-1, M1-2, and M1-3 is separated from dielectric materials 130 of metal layer M1 by a separate barrier layer 205A. A portion of barrier layer 205A is shown in between each via VIA and a corresponding metal bar M1-1, M1-2, and M1-3. In operation, metal layer M2 is electrically coupled with a corresponding metal bar M1-1, M1-2, or M1-3 through a corresponding via VIA1, VIA2, and VIA3 and the portion of barrier layer 205A.

Barrier layer 205 prevents copper (Cu) diffusion into dielectric material 130 of dielectric layer 130-1. In some embodiments, barrier layer 205 includes Ti, TiN, Ta, Tan, and combinations thereof. Other materials are within the scope of various embodiments.

An etch stop layer (ESL) 207A prevents underlying metal features from being over etched during the via etch process. ESL 207A may also be used to control a shape of a via VIA.

Dielectric layer 130-1 includes a via VIA1, a via VIA2, and a via VIA3 that electrically connect metal bar M1-1, metal bar M1-2, and metal bar M1-3, respectively, to metal layer M2. For illustration, each of a via VIA1, VIA2, and VIA3 is called a via VIA. A via VIA is also call a conduction piece as electrical conductions pass between metal layer M1 and layer M2 through via VIA. Each via VIA is surrounded by barrier layer 205A. Effectively, each via VIA is separated from dielectric material 130 of dielectric layer 130-1 by barrier layer 205A.

In some embodiments, dielectric layer 130-1 is formed by depositing dielectric material 130 over etch stop layer 207 A that is on top of metal layer M1. As shown in FIG. 2A, metal layer M1 includes metal bars M1-1, M1-2, and M1-3 separated by dielectric material 130.

In some embodiments, after metal layer M2 is deposited on top of dielectric layer 130-1 that includes vias VIA1, VIA2, and VIA3, a chemical and mechanical process (CMP) is perform on metal layer M2.

Different ways of forming semiconductor structure 200A are within the contemplated scope of this disclosure.

Figure 2B:
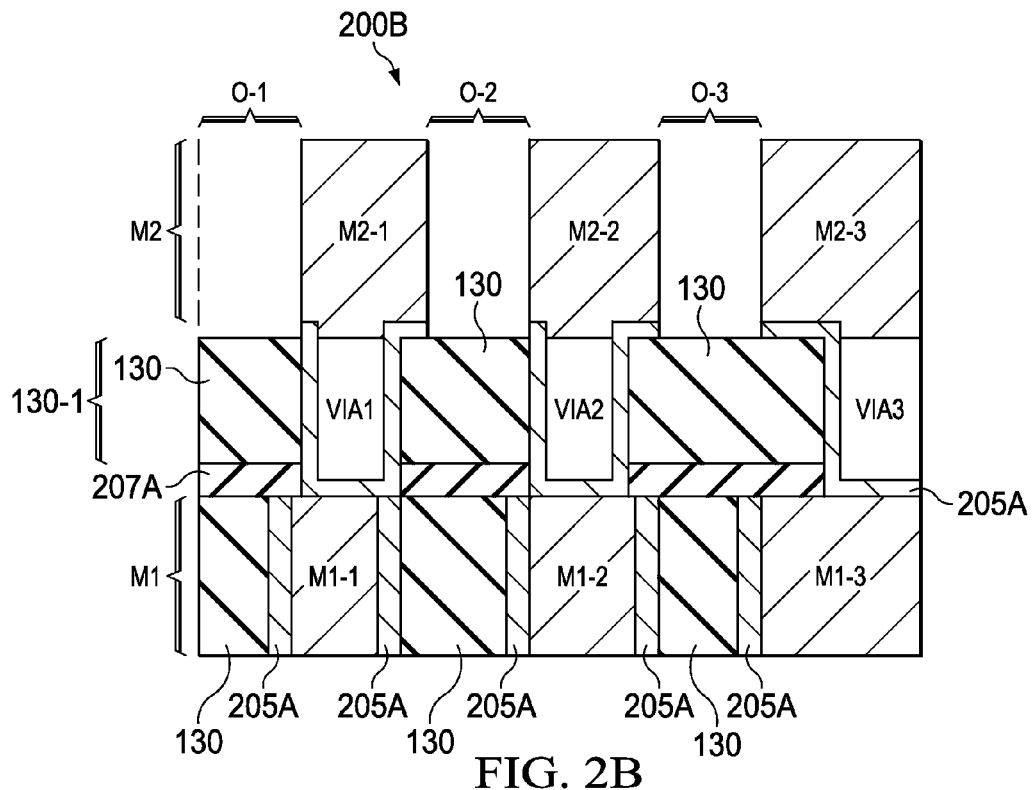

FIG. 2B is a cross section diagram of a semiconductor structure 200B, in accordance with some embodiments. Structure 200B results from etching structure 200A in FIG. 2A. To avoid obscuring the drawing, details of various elements of structure 200B and structures 200C to 200F in corresponding FIGS. 2C to 2F are not labeled, and can be referenced to structure 200A.

Compared with structure 200A, in structure 200B, metals originally in openings O-1, O-2, and O-3 are etched and removed. Corresponding portions of barrier layer 205 are also removed. As a result, metal layer M2 has three separate metal bars M2-1, M2-2, and M2-3. Effectively, via VIA1 connects metal bars M1-1 and M2-1, via VIA2 connects metal bars M1-2 and M2-2, and via VIA3 connects metal bars M1-3 and M2-3. Dielectric material 130 of dielectric layer 130-1 is exposed through openings O-1, O-2, and O-3. Different ways to etch or remove metals originally in openings O-1, O-2, and O-3 to form structure 200B are within the skill of one in the art.

In some embodiments, each of a metal bar M2-1, M2-2, and M2-3 is used to form a conductive line to connect circuit elements formed on semiconductor structures, such as structures 200A to 200F used in the illustration of corresponding FIGS. 2A to 2F. Each of metals bar M1-1, M1-2, M1-3, M2-1, M2-2, and M2-3 is shown to have a size larger than a via VIA. A size of each of the metal bars that is smaller than or equal to a size of a via VIA is within the contemplated scope of the present disclosure.

Figure 2C:
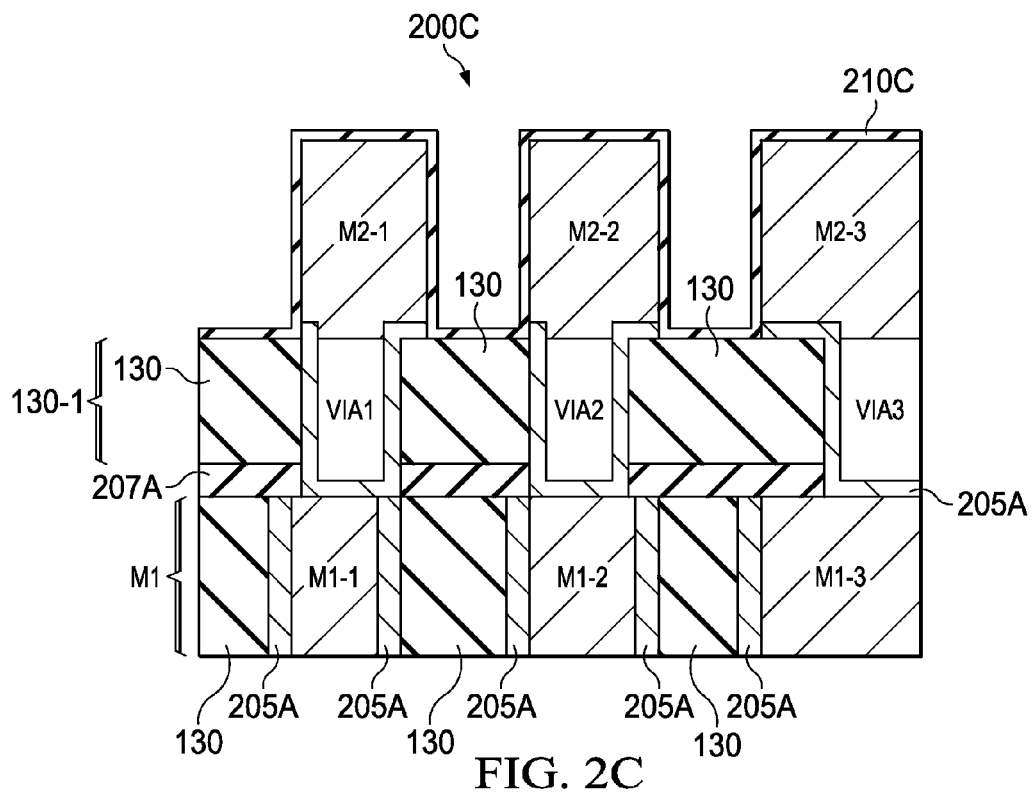

FIG. 2C is a cross section diagram of a semiconductor structure 200C, in accordance with some embodiments. Structure 200C results from providing a protecting layer 210C to structure 200B in FIG. 2B. In some embodiments, protecting layer 210C covers and is in contact with exposed dielectric material 130 of dielectric layer 130-1. Protecting layer 210C also covers and is in contact with metal bars M2-1, M2-2, and M2-3. In some embodiments, protecting layer 210C does not cover at least one of metal bars M2-1, M2-2, or M2-3. Protecting layer 210C is also called a pre-cap layer because protecting layer 210C is provided prior to providing a capping layer 220D illustrated in FIG. 2D.

In some embodiments, protecting layer 210C includes carbon doped nitride (SiCN), carbon nitride (CN), silicon nitride (SiN), silicon carbon (SiC), etc. Other materials could be used for protecting layer 210C as well. Various factors are used in selecting a material for protecting layer 210C. A factor includes manufacturing process compatibilities. For example, a material is selected such that dielectric material 130 of dielectric layer 130-1 is not damaged by metal ion penetration and plasma conversion into dielectric layer 130-1, is not damaged by moisture during a CMP process for metal layer M2, etc. For another example, a material of protecting layer 210C is selected to protect properties of dielectric material 130 of layer 130-1 having the particular K value. When dielectric material 130 of dielectric layer 130-1 has a different K value, a different material is selected for dielectric layer 130-1, for example. Another factor used in selecting a material for protecting layer 210C includes good adhesion of protecting layer 210C to copper in contact with protecting layer 210C, such as copper of metal bars M2-1, M2-2, and M3-3 of metal layer M2. In such a condition, materials with no oxygen, carbon or nitride are considered.

In some embodiments, protecting layer 210C is about 15 Å thick, which is adopted based on simulations. In some embodiments, a simulation analysis reveals that a thicker protecting layer 210C results in a less metal ion penetration into dielectric layer 130-1. When protecting layer 210C is above 15 Å, however, the amount of metal ion penetration is not significantly further reduced. In some embodiments, the thickness of protecting layer 210C is determined such that dielectric material 130 of dielectric layer 130-1 is protected from metal ion diffusion and plasma conversion onto dielectric material 130 during a precursor soak and plasma treatment of structure 200C. Depending on the amount of metal ions in dielectric layer 130-1, metal ions change the low K properties of dielectric material 130 in dielectric layer 130-1 and thus damage dielectric layer 130-1. Similarly, depending on the amount of plasma in dielectric layer 130-1, plasma also changes the low K properties of dielectric material 130 in dielectric layer 130-1 and thus damages dielectric layer 130-1. Metal ions and plasma are thus disfavored elements in dielectric layer 130-1.

In some embodiments, the thickness of protecting layer 210C is sufficient to protect dielectric material 130 of dielectric layer 130-1, but not overly thick so that it results in reversed effects and degrades electrical performance of semiconductor structures. For example, based on a simulation result, a protecting layer 210C thicker than about 8 Å provides an acceptable reduction in metal ion penetration, and a protecting layer 210C thicker than 15 Å results in a higher device capacitance and degrades electrical property of structures 200C to 200F in FIGS. 2C to 2F.

In some embodiments, a chemical vapor deposition (CVD) process or an atomic layer disposition (ALD) process is used to deposit protecting layer 210C. Other processes for depositing protecting layer 210C are within the scope of various embodiments.

Figure 2D:
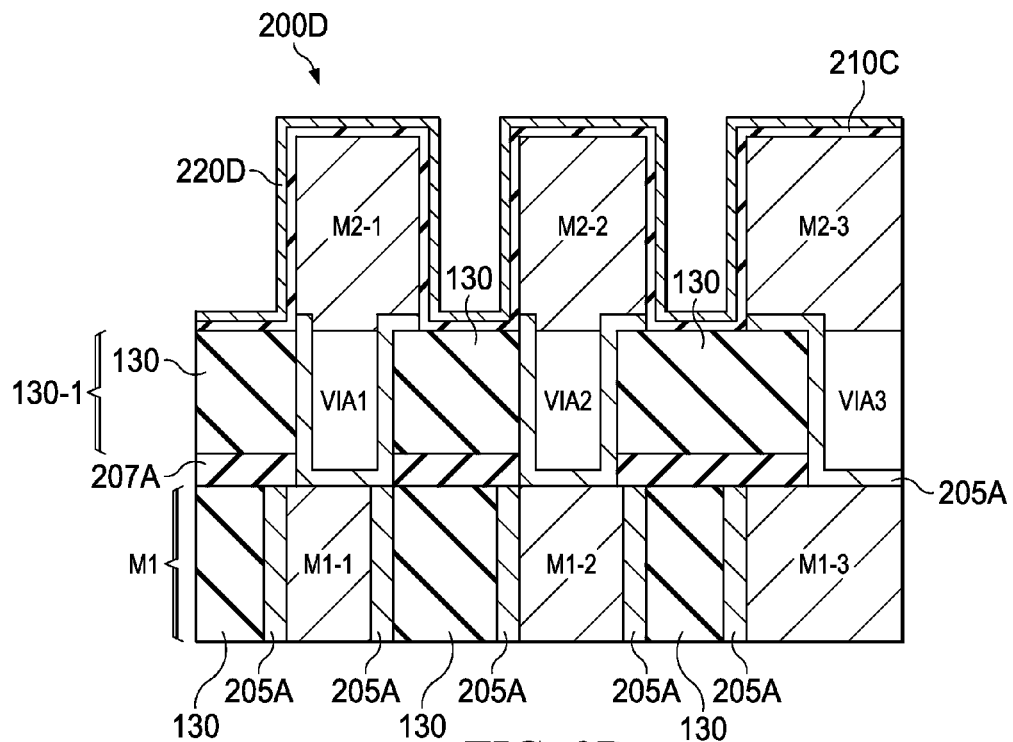

FIG. 2D is a cross section diagram of a structure 200D, in accordance with some embodiments. Structure 200D results from providing a capping layer 220D to structure 200C in FIG. 2C. Capping layer 220D is used to enhance reliability of conductive lines, such as those formed from metal bars M2-1, M2-2, M2-3, etc.

In some embodiments, capping layer 220D covers and is in contact with protecting layer 210C. In some embodiments, a precursor soak process is performed on structure 200C to result in capping layer 220D. For example, structure 200C is soaked with an organic metal soak process. An ultra-violet, a plasma treatment or an anneal process is then used to reduce the electron migration effect and improve quality of capping layer 220D. Other processes to provide capping layer 220D are within the scope of various embodiments.

In some embodiments, capping layer 220D includes one or a combination of metal oxide, metal nitride and/or metal oxynitride. Capping layer 220D is also called a metal oxynitride capping layer because capping layer 220D includes oxynitride. Other materials are within the scope of various embodiments.

Figure 2E:
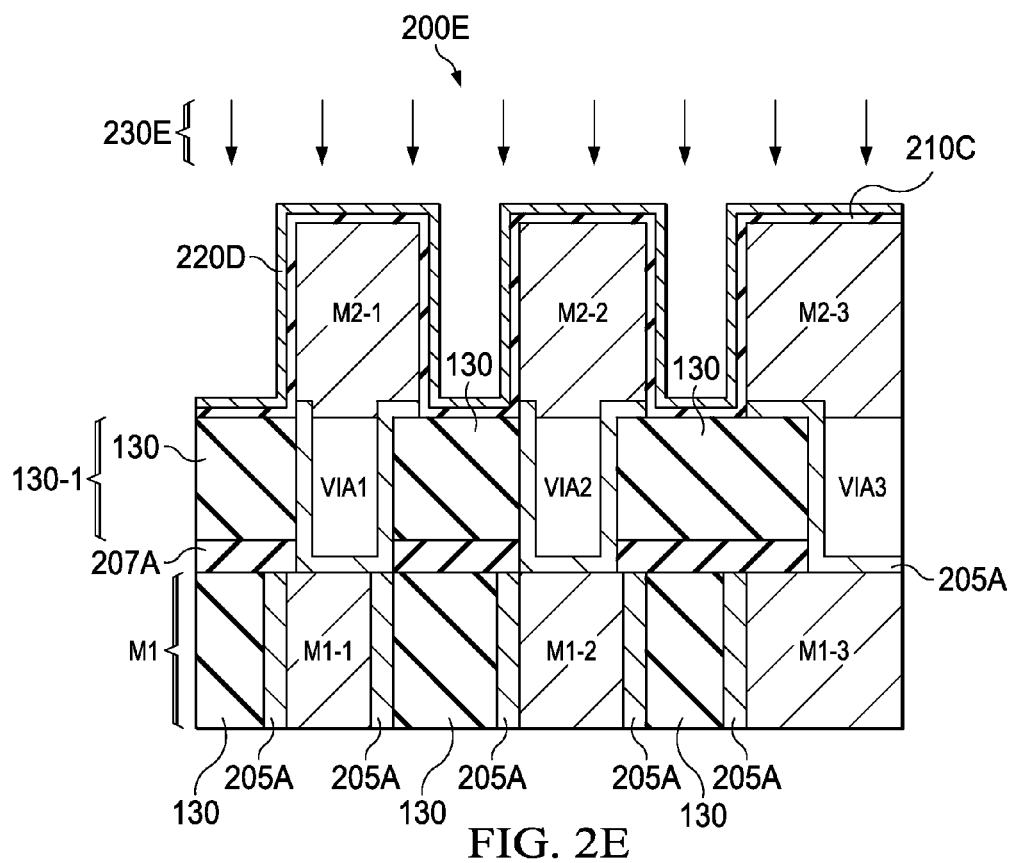

FIG. 2E is a diagram of a structure 200E, in accordance with some embodiments. Image 200E includes structure 200D in FIG. 2D being treated with plasma in a plasma treatment process. In some embodiments, plasma 230E is provided to structure 200D in an anneal process. Different ways of depositing plasma 230E are within the scope of various embodiments.

Figure 2F:
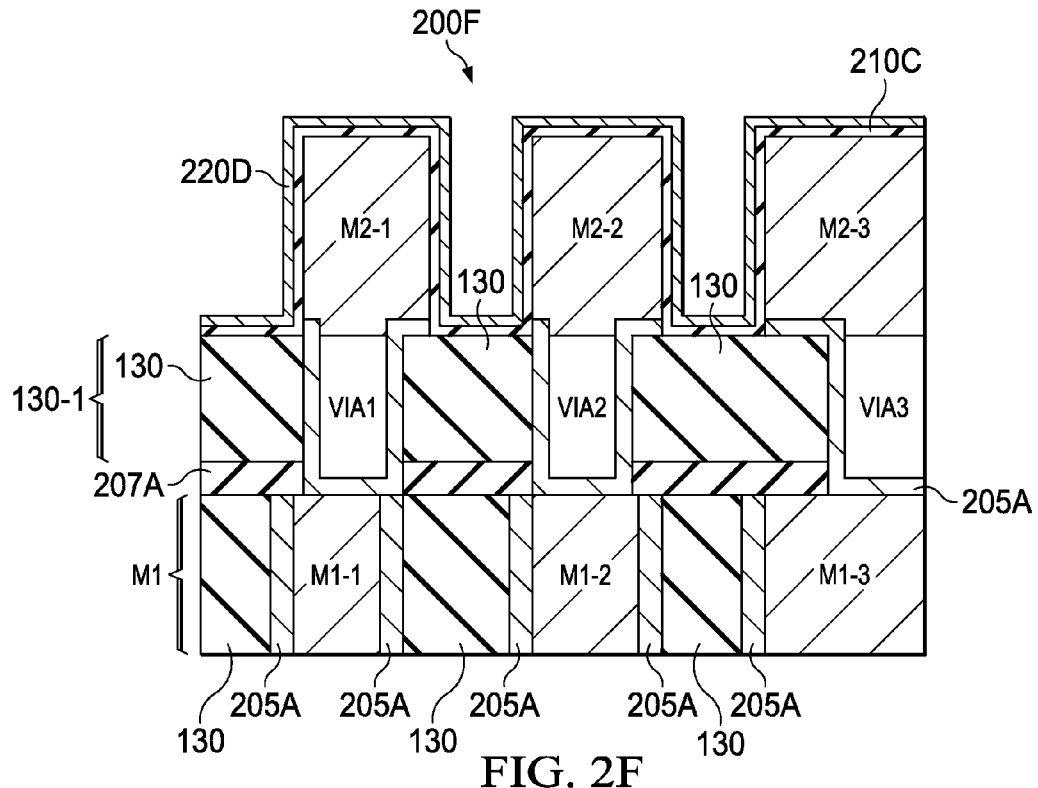

FIG. 2F is a cross section diagram of a structure 200F, in accordance with some embodiments. FIG. 200F is FIG. 200D after being subjected to the plasma treatment process illustrated in FIG. 2E. A depth D illustrates a region of dielectric layer 130-1 that includes metal ions and/or plasma penetrated into dielectric layer 130-1 during the processes illustrated in FIGS. 2D and 2E.

In some embodiments, because protecting layer 210C covers dielectric layer 130-1, disfavored elements such as metal ions and plasma in depth D in FIG. 2F are reduced compared with a structure that does not include protecting layer 210C. As a result, dielectric layer 130-1 is not damaged even when a time to process metal oxide, metal nitride and/or metal oxynitride in a capping layer 220D is prolonged. Consequently, various embodiments of the present disclosure are advantageous over existing approaches in which a prolonged capping process damages dielectric layer 130-1.

Illustrative Waveforms

Figure 3:
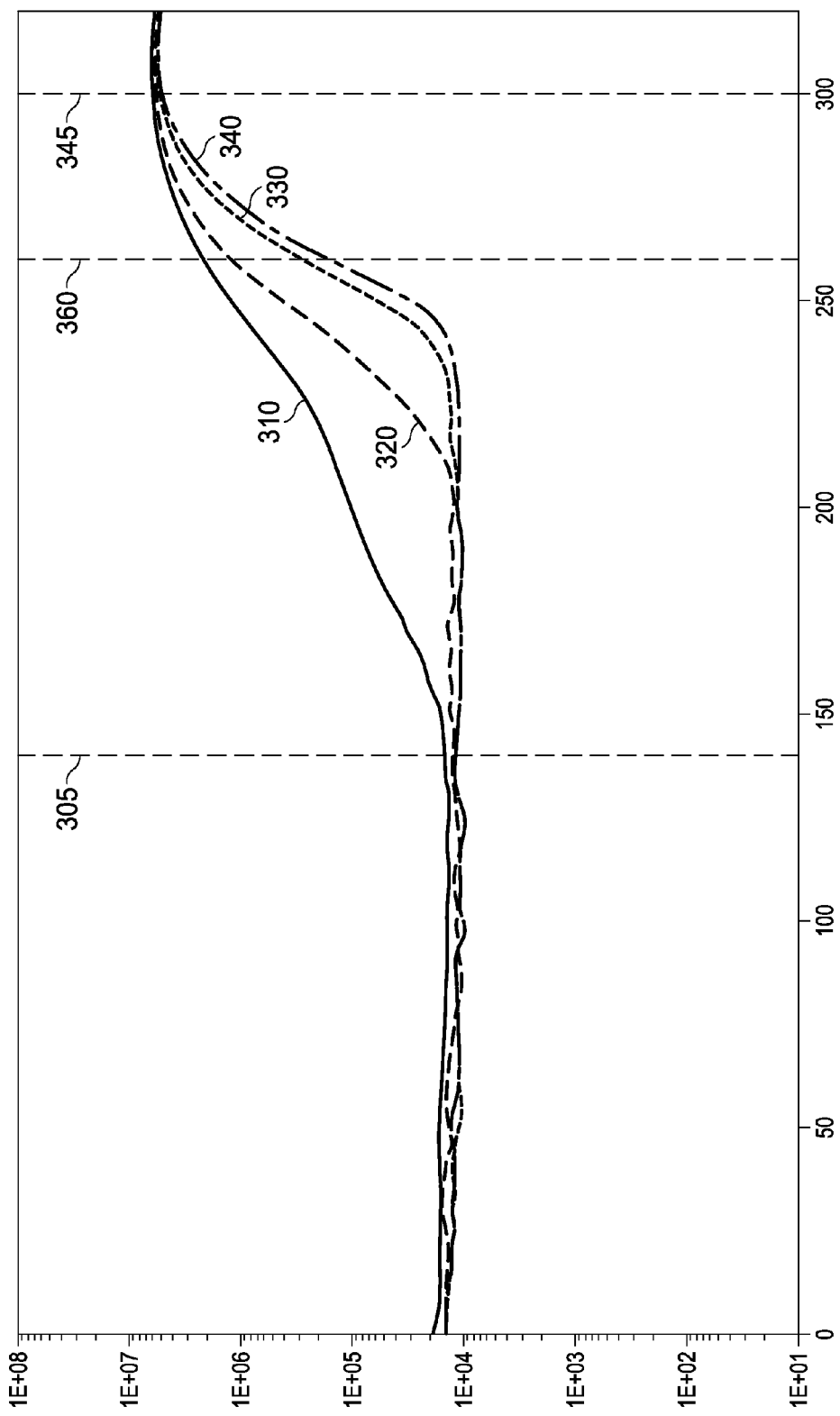
FIG. 3 is a graph of various waveforms, in accordance with some embodiments.

FIG. 3 is a graph of various curves indicating relationships between an intensity of metal ion signal versus depth D of dielectric layer 130-1 in FIG. 2F with different thicknesses of protecting layer 210C, in accordance with some embodiments. A larger signal intensity indicates a larger amount of metal ions.

The X-axis indicates values in nano meters (nm) of depths D of dielectric 130-1 in FIG. 2A. The Y-axis indicates the signal intensity of metal ions.

A curve 310 represents a relationship between a metal ion signal intensity and depth D when there is no protecting layer 210C.

A curve 320 represents a relationship between a metal ion signal intensity and depth D when the thickness of protecting layer 210C is 8 Å.

A curve 330 represents a relationship between a metal ion signal intensity and depth D when the thickness of protecting layer 210C is 15 Å.

A curve 340 represents a relationship between a metal ion signal intensity and depth D when the thickness of protecting layer 210C is 30 Å.

For illustration, depth D of dielectric layer 130-1 includes three regions. A first region is when depth D is less than about 140 nm as indicated by line 305. A second region is between depth D of about 140 nm and about 300 nm as indicated by line 345, and a third region is when depth D is above 300 nm.

Based on curves 310, 320, 330, and 340, in the first region and the third region of dielectric layer 130-1, the signal intensity of metal ions is about the same in all situations in which there is no protecting layer 210C, when protecting layer 210C is about 8 Å, 15 Å, or 30 Å.

In the second region of dielectric layer 130-1, however, when protecting layer 210 is thicker, the signal intensity of metal ions is less. For example, using a line 360 as a reference when depth D is about 260 nm, curve 310 is above curve 320, curve 320 is above curve 330, and curve 330 is above curve 340, which indicates that the signal intensity of metal ion is in the order of highest to lowest when there is no protecting layer 210C, when protecting layer 210C is about 8 Å, 15 Å, and 30 Å. In other words, the amount or level of metal ions is in the order of highest to lowest when there is no protecting layer 210C, when protecting layer 210C is about 8 Å, 15 Å, and 30 Å.

Exemplary Method

Figure 4:
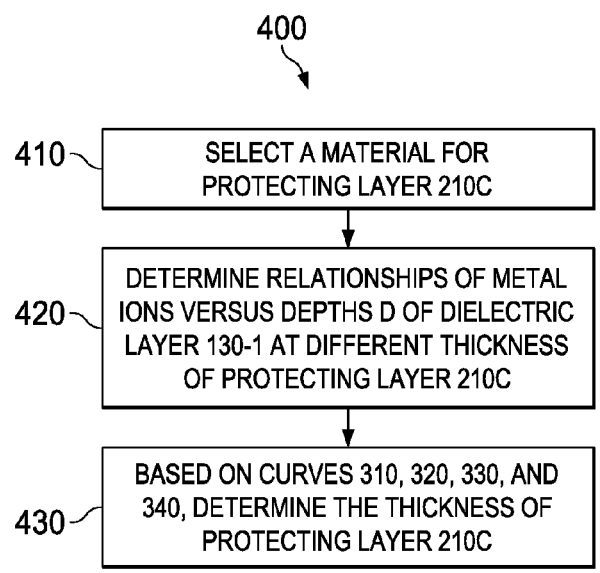
FIG. 4 is a flowchart of a method of selecting a protecting layer, in accordance with some embodiments.

FIG. 4 is a flowchart of a method 400 for selecting protecting layer 210C in FIG. 2C, in accordance with some embodiments.

In operation 410, a material of protecting layer 210C is selected based on properties of dielectric material 130 of dielectric layer 130-1 to be protected, taking into account that structure 200A will be subject to a capping layer process, such as a process to deposit capping layer 220D in FIG. 2D. In some embodiments, SiCN, SiN, SiC, or CN is selected as material 130 for dielectric layer 130-1 based on various factors. For example, SiCN, SiN, SiC, or CN protects properties of low K dielectric material 130, and acts as good adhesion to copper or metal in metal layer M2.

In operation 420, relationships of signal intensities of metal ions versus depths of dielectric layer 130-1 at different thicknesses of protecting layer 210C are determined, such as the relationships illustrated in FIG. 3.

In operation 430, based on curves 310, 320, 330, and 340, a thickness is determined for protecting layer 210C. For example, a thickness of 15 Å or 30 Å is selected, considering an acceptable amount of metal ions in dielectric layer 130-1, benefits and costs of generating protecting layer 210C and inverse effects of protecting layer 210C if protecting layer 210C is thicker than 15 Å, etc. An example of inverse effect includes higher capacitance of protecting layer 210C when protecting layer 210C is thicker than 30 Å, for example.

In the above illustration, a thickness and a material of protecting layer 210C are selected based on amounts of metal ions diffused into depth D of dielectric layer 130-1. Alternatively, and or additionally, a selection based on plasma conversion is similar and is within the scope of various embodiments. Dielectric layer 130-1 is used for illustration. Protecting another dielectric layer, such as one between two metal layers, is similar and is within the scope of various embodiments.

Various embodiments of the present disclosure are advantageous over other approaches. For example, in some embodiments, protecting layer 210C protects low-K dielectric material 130 of dielectric layer 130-1 from being damaged. For another example, during a deposition of metal oxide, metal nitride and/or metal oxynitride of capping layer 220D in FIG. 2D, protecting layer 210C reduces and/or eliminates metal ions from diffusing into depth D of dielectric layer 130-1. Protecting layer 210C also reduces and/or eliminates plasma conversion into depth D of dielectric layer 130-1 during the plasma annealing process illustrated in FIG. 2E. In contrast, in other existing approaches that do not include protecting layer 210C, low-K dielectric material 130 of dielectric layer 130-1 is damaged by the metal ion diffusion and/or plasma conversion.

In some embodiments, a semiconductor structure comprises a dielectric layer, a conduction piece, a first metal piece, a first protecting layer, and a second protecting layer. The conduction piece is surrounded by electrical materials of the dielectric layer. The first metal piece is over the dielectric layer and is in contact with the conduction piece. The first protecting layer covers dielectric materials of the dielectric layer that are not covered by the first metal piece. The second protecting layer is over the first protecting layer.

Some embodiments regard a method for forming a protecting layer, the method comprising determining a plurality of relationships, based on the plurality of relationships, determining the thickness of the protecting layer, and forming the protecting layer at the predetermined thickness, in contact with a dielectric layer. Each relationship of the plurality of relationships includes an amount of disfavored elements in the dielectric layer versus depths of the dielectric layer at a particular thickness of the protecting layer.

In some embodiments, a semiconductor structure comprises a dielectric layer, a conduction piece, a first metal piece, a first protecting layer. The conduction piece is surrounded by electrical materials of the dielectric layer. The first metal piece is over the dielectric layer and is in contact with the conduction piece. The first protecting layer covers dielectric materials of the dielectric layer that are not covered by the first metal piece the first protecting layer, includes at least one of silicon doped nitride, carbon nitride, silicon nitride, and silicon carbon, and is configured reduce and/or eliminate disfavored elements in the dielectric layer.

A number of embodiments have been described. It will nevertheless be understood that various modifications may be made without departing from the spirit and scope of the disclosure. For example, three vias VIA1, VIA2, VIA3, three metal bars M1-1, M1-2, and M1-3 or M2-1, M2-2, and M2-3 are used for illustration. Another number of vias and/or metal bars is within the scope of various embodiments.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A semiconductor structure comprising:
a dielectric layer;
a conduction piece surrounded by a dielectric material of the dielectric layer;
a barrier layer separating the conduction piece from the dielectric material, the barrier layer extending above a topmost surface of the conduction piece;
a first metal piece over the dielectric layer and in contact with the conduction piece;
a first protecting layer covering dielectric materials of the dielectric layer that are not covered by the first metal piece and extending along a top surface and sidewalls of the first metal piece; and
a second protecting layer over the first protecting layer, wherein the first protecting layer extends along the top surface and sidewalls of the first metal piece and the second protecting layer extends along the first protecting layer over the top surface and sidewalls of the first metal piece.

2. The semiconductor structure of claim 1, wherein:
the semiconductor structure is configured to be subject to a plasma treatment process.

3. The semiconductor structure of claim 1, wherein:
the first protecting layer includes at least one of silicon doped nitride, carbon nitride, silicon nitride, and silicon carbon.

4. The semiconductor structure of claim 1, wherein:
a thickness of the first protecting layer is at most about 30 Å.

5. The semiconductor structure of claim 1, wherein:
the semiconductor structure is configured to meet at least one of the following conditions:
the first protecting layer is configured to reduce and/or eliminate metal ion diffusion into the dielectric layer; and
the first protecting layer is configured to reduce and/or eliminate plasma elements into the dielectric layer.

6. The semiconductor structure of claim 1, further including metal ions in the dielectric layer, wherein a concentration of the metal ions diminishes with increasing depth into the dielectric layer.

7. The semiconductor structure of claim 1, wherein the second protecting layer comprises an oxynitride.

8. The semiconductor structure of claim 1, wherein the conduction piece is a via conductor electrically connecting the first metal piece to a second metal piece underlying and physically contacting the via conductor.

9. The semiconductor structure of claim 1, further comprising:
a second conduction piece surrounded by the dielectric material of the dielectric layer; and
a second metal piece over the dielectric layer and in contact with the second conduction piece, wherein the first protecting layer does not cover the second metal piece.

10. A semiconductor structure comprising:
a dielectric layer;
metal ions in the dielectric layer, wherein a concentration of the metal ions diminishes with increasing depth into the dielectric layer;
a via surrounded by dielectric materials of the dielectric layer, wherein a topmost surface of the via is substantially co-planar with a topmost surface of the dielectric layer;
a first metal bar comprising copper over and in direct contact with the via, wherein the topmost surface of the via is narrower in width than the first metal bar, and wherein at least a portion of the topmost surface of the dielectric layer is directly below the first metal bar; and
a first protecting layer over a top surface and sidewalls of the first metal bar and over the dielectric materials of the dielectric layer not covered by the first metal bar, wherein the first protecting layer includes at least one of silicon doped nitride, carbon nitride, silicon nitride, and silicon carbon.

11. The semiconductor structure of claim 10, further comprising:
a second protecting layer over the first protecting layer which extends over the top surface and sidewalls of the first metal bar.

12. The semiconductor structure of claim 11, wherein:
the semiconductor structure is configured to be subject to a plasma treatment process.

13. The semiconductor structure of claim 11, wherein:
the second protecting layer comprises at least one of a metal oxide, a metal nitride, and a metal oxynitride.

14. The semiconductor structure of claim 10, wherein:
a thickness of the first protecting layer is at most 30 Å.

15. The semiconductor structure of claim 10, wherein the first protecting layer is configured to reduce and/or eliminate disfavored elements in the dielectric layer, wherein the disfavored elements include metal ions and/or plasma.

16. A semiconductor structure, comprising:
a substrate;
a first metal layer embedded in a first dielectric layer, wherein metal features of the first metal layer are separated from the first dielectric layer by a barrier layer;
a first etch stop layer on the first dielectric layer;
a second dielectric layer on the first etch stop layer;
a second metal layer embedded in the second dielectric layer, wherein second metal features of the second metal layer are in electrical contact with respective metal features of the first metal layer, and wherein the second metal features are separated from the second dielectric layer by a second barrier layer, and wherein a portion of the second barrier layer extends over and on the second dielectric layer;
metal ions in the second dielectric layer, wherein a concentration of the metal ions diminishes with increasing depth into the second dielectric layer;
a third metal layer on the second metal layer, wherein third metal features of the third metal layer are in electrical contact with respective second metal features;
a carbon-containing protecting layer extending along the top surface of the second dielectric layer and extending along a sidewall of respective third metal features; and
a second protecting layer extending along the carbon-containing protecting layer.

17. The semiconductor structure of claim 16, wherein the carbon-containing protecting layer extends conformally along respective third metal features.

18. The semiconductor structure of claim 17, wherein the second protecting layer extends conformally atop the carbon-containing protecting layer and the respective third metal features.

19. The semiconductor structure of claim 16, wherein a thickness of the carbon-containing protecting layer is between 8 Å and 15 Å.

* * * * *